United States Patent
Akatsu et al.

(10) Patent No.: US 6,449,202 B1
(45) Date of Patent: Sep. 10, 2002

(54) DRAM DIRECT SENSING SCHEME

(75) Inventors: Hiroyuki Akatsu, Yorktown Heights, NY (US); Louis L. Hsu, Fishkill, NY (US); Jeremy K. Stephens, New Windsor, NY (US); Daniel W. Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/929,593

(22) Filed: Aug. 14, 2001

(51) Int. Cl.$^7$ ................................................ G11C 7/00

(52) U.S. Cl. ....................................... 365/205; 365/203

(58) Field of Search ................................. 365/205, 203

(56) References Cited

U.S. PATENT DOCUMENTS

| | | | |
|---|---|---|---|
| 5,790,467 A | | 8/1998 | Haukness et al. ........... 365/205 |
| 5,831,919 A | | 11/1998 | Haukness et al. ........... 365/205 |
| 5,943,253 A | | 8/1999 | Matsumiya et al. .......... 365/63 |
| 6,072,749 A | | 6/2000 | Nakamura et al. ........ 365/238.5 |
| 6,088,291 A | | 7/2000 | Fujioka et al. ............... 365/233 |
| 6,097,623 A | * | 8/2000 | Sakata et al. ................ 365/145 |
| 6,097,634 A | * | 8/2000 | Sugiyama ............... 365/185.21 |
| 6,128,238 A | | 10/2000 | Nagai et al. ................. 365/207 |

FOREIGN PATENT DOCUMENTS

| | | | | |
|---|---|---|---|---|
| JP | 63-211190 A | * | 9/1988 | ........... G11C/11/34 |
| JP | 63-211195 A | * | 9/1988 | ........... G11C/11/34 |
| JP | 63-228496 A | * | 9/1988 | ........... G11C/11/34 |

OTHER PUBLICATIONS

Betty Prince, "Semiconductor Memories", 1983, Wiley, $2^{nd}$ edition, pp. 172 and 173.*
"A 23–ns 1–MB BiCMOS DRAM" IEEE Journal of Solid–State Circuits, vol. 25, No. 5, Oct. 1990, pp. 1102–1111.

* cited by examiner

*Primary Examiner*—M. Tran
(74) *Attorney, Agent, or Firm*—Scully, Scott, Murphy & Presser; Daryl K. Neff, Esq.

(57) ABSTRACT

A direct sensing circuit and method for reading data from a memory cell connected to a bitline, with open bitline sensing without using a reference bitline signal, onto a data line in a data read operation. Prior to the data read operation, both the bitline and the data line are precharged to precharge voltages and a sense node is precharged to ground. A pFET device has its gate coupled to a signal developed on the bitline from the memory cell to detect and amplify the signal level thereof, and has its source coupled to a voltage source and its drain coupled to a sense node, such that the signal developed on the bitline determines the degree of turn-on of the pFET device. An nFET device has its gate coupled to the sense node to detect and amplify the signal level thereof, and has its drain coupled to the data line. When sensing a low data signal, the signal developed on the bitline causes subthreshold voltage leakage current through the pFET device to charge the gate of the nFET device which is floating to amplify the signal developed on the bitline to pull down the precharged data line. When sensing a high data signal, the pFET device and the nFET device remain inactivated, and the data line remains at its precharge high voltage. An nFET writeback device is coupled between the data line and the bitline which is switched on to begin a data writeback into the memory cell when the signal develops on the data line.

17 Claims, 6 Drawing Sheets

FIG. 2
PRIOR ART (G. KITSUKAWA)

DRAM DIRECT SENSING SCHEME

BACKGROUND OF THE INVENTION

1. Field of the Invention

The present invention relates generally to a DRAM direct sensing scheme, and more particularly pertains to a DRAM direct sensing scheme which relies upon the pFET threshold voltage of a pFET device to detect a signal development level with a significant reduction in the number of devices in the primary sense amplifier.

In the design of DRAMs, the direct sensing scheme is emerging and becoming more popular because future DRAMs need to use a lower bitline voltage. This restriction is applied from both scaling and performance points of view. From the scaling point of view, the device sizes need to be reduced to obtain a higher density of the memory. This requires reduced operation voltages to meet the reliability specifications and basic device performance requirements like the device threshold voltage Vt roll-off. Performance requirements such as speed require a lower bit-line high voltage Vblh to obtain more overdrive of array devices with a limited word line voltage Vpp. The word line voltage Vpp is limited by the gate oxide thickness, which is reduced as the device size is reduced. This is especially true for the write back operation.

If Vblh is reduced, however, the conventional 1/2 Vblh sensing scheme adopted in most DRAMs on the market is not practical to implement due to its low signal development. This encourages the direct sensing scheme.

Simultaneously, lowering the operating voltages, especially lowering Vpp, makes it more difficult to writeback "high" data into the cell. This is based upon the fact that the back bias of the array device increases as "high" data is written into the cell, which increases Vt and reduces the overdrive of the array device. This adversely impacts the writeback time of the "high" cell, which limits high speed applications.

One way to solve the above problem is to only sense "low" with a direct sensing scheme and a VDD precharge level. One problem with this scheme, however, is the very small signal difference between "low" and "high" cells, because the cell voltage of the "high" cell is not well defined. Therefore, one approach is to amplify the developed signal.

Because this is a DRAM, it is necessary to writeback the data after reading it. The read operation in a DRAM is inherently destructive of the data because once the transistor for a memory cell is switched on, the charge on the memory cell capacitor dissipates onto the bitline and eliminates its once readable logic level. Therefore, conventional DRAMs employ a writeback cycle as part of the read operation. With a conventional sense amplifier circuit, there is a delay between the time the accessed sense amplifier detects data from the memory cell and the time the data can be fully written back to the data cell, because of the extra loading on the bit line of the data line (DQ) which carries the data out of the primary sense amplifier. By employing a sense amplifier which terminates the bit line into the gate of the transistor, the bit line is decoupled from the loading of the DQ line which both reduces the time sense data, and also improves the ability to sense the data correctly.

2. Discussion of the Prior Art

For applications which require a fast random access time, the traditional CMOS cross-coupled sense amp has limitations in both sensing time and writeback. The writeback limitation can be avoided by performing a technique such as a destructive read operation (Disclosure: Toshi Kirihata et al). The sensing time limits the memory cycle time because the bitline signal must be amplified and transferred to a dataline. Sensing a small bitline signal and transferring it to a digital data line with traditional techniques requires more than 5 ns. Hence the need for higher speed direct sense techniques.

1) Conventional cross-coupled sense amps without reference cells require a VDD/2 bitline voltage precharge. When the sense amps are set, positive moving bitlines couple unselected wordlines upward, which increases cell leakage.

2) A conventional direct sensing scheme with a current mirror sense amplifier uses a bitline pair and a data line pair per bit. A current mirror sense amplifier requires a large design space, resulting in poor density and an expensive solution.

3) Some DRAM macros require sensing and reading out of every bitline signal, rather than decoding a portion of the senseamps and reading out a subset. This requires a read/write head which can couple the sense amp data to external datalines without creating a read disturb. A read disturb occurs when a precharged dataline is connected to a sense amp. This effect is reduced if a pair of datalines are connected to both true and complement sense amp nodes. In dense DRAM macros where every cell along a wordline must be outputted, there is a large area penalty to operate with differential datalines and their associated circuitry. In some cases, it is impossible to arrange a differential data line pair for each bitline pair because of design rule constraints, which makes it difficult or impossible to use a conventional direct sensing scheme.

4) As technology advances to smaller lithographies, voltages must be scaled to lower levels to reduce oxide stress. It is known that the device threshold voltage Vt does not scale efficiently with power supply, and so overdrive is lost on FETs. VDD/2 sensing schemes must operate with very low overdrive at low power supplies, and hence suffer a large degradation in sensing speed as the device Vt increases at low temperatures.

5) Testing of on-chip DRAM macros is difficult because of pattern sensitivities. One advantage of the sensing scheme of the present invention is that only every other bitline is active, so that alternating bitlines can be held at AC ground to eliminate line to line coupling effects. The increased bitline signal also increases sensing margin.

6) It is preferable to maintain the same polarity (even number of signal inversions) between the bitline BL signal and the dataline (DQ) signal. If this condition is met, the primary sense amplifier can be employed to write-back data into the storage capacitor.

7) It is preferable to minimize logical "glitches" on the datalines (DQs) so that dynamic logic can be used to control the data buses. Here, a "glitch" is defined as a signal waveform that will cause a logical error if it is an input to a dynamic logic gate.

Atsumi et al (ISSCC 2000, p276) discusses a direct sensing scheme for EEPROM with a sense amplifier using an NFET. This requires a reference bitline, and no feedback loop exists to writeback data to the bitline (because this is an EEPROM).

Suh et al (J. Solid State Circuits, 31, 1025 (1996)) discusses a direct sensing scheme for a DRAM which needs a reference voltage to power the rewrite amplifier and uses an NFET for the sensing.

Figure 1:
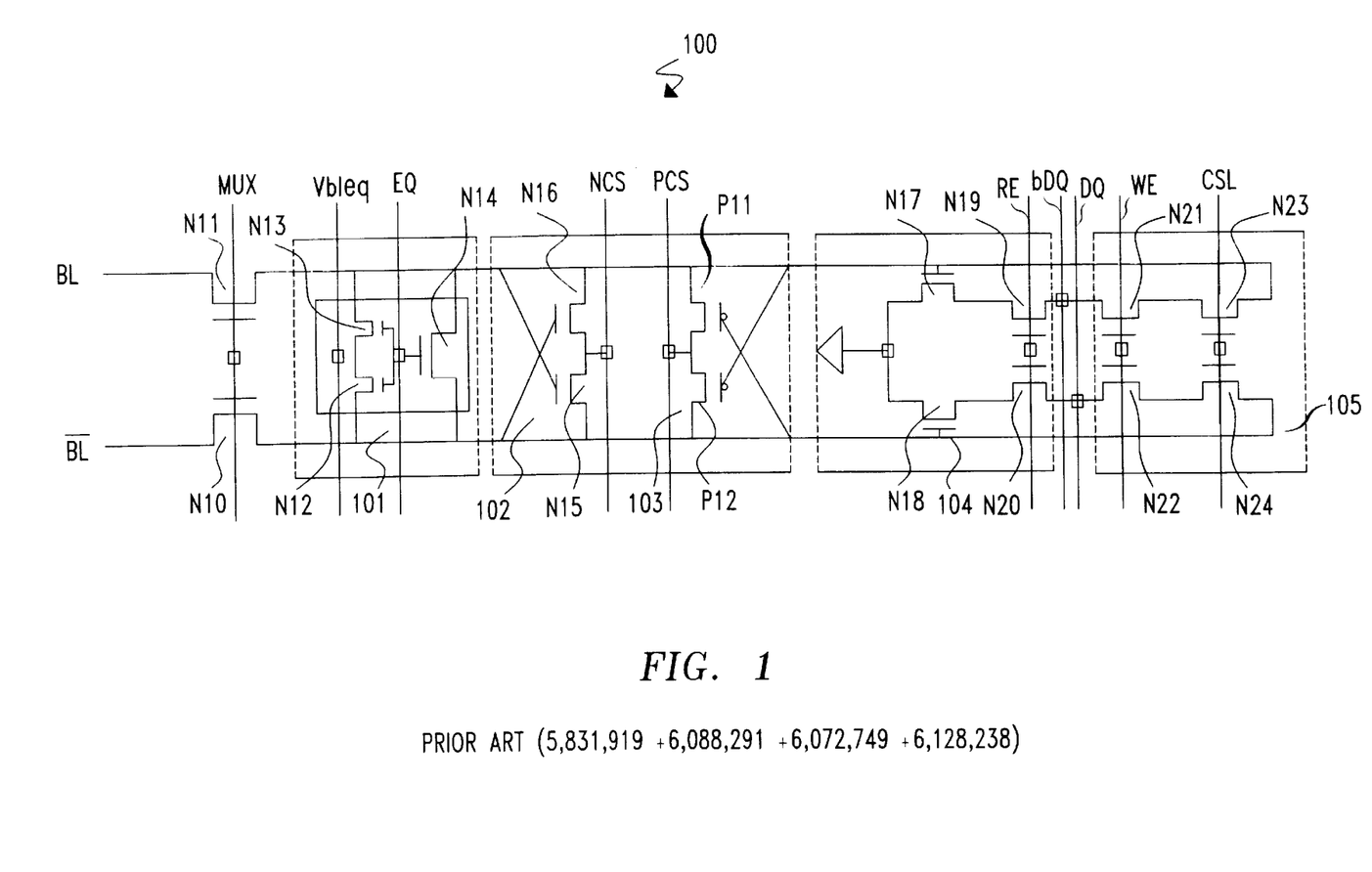
FIG. 1 illustrates a typical prior art direct sensing circuit using both a direct sensing block and also a cross-coupled sensing block.

FIG. 1 illustrates a typical prior art direct sensing circuit using both a direct sensing block and also a cross-coupled sensing block. The direct sensing circuit block consists of a read portion 104 and a write portion 105. The read portion is triggered by a read control RE. The write portion is triggered by a write control WE. A pair of switches N10 and N11 are provided to selectively connect the Bitline pairs to the sense amplifier via a control MUX. Another pair of switches N23 and N24 is provided to selectively connect the sense amplifier with a pair of datalines DQ and bDQ. The direct sensing block includes two further pull down NMOS devices N17 and N18. When the complementary signals are developed on the Bitline pair and are being transferred to the sense amplifier, the signals are first amplified by a cross-coupled sense amplifier which is formed by a p-latch 103, and an n-latch 102. When the read signal is triggered, the direct sensing devices further enhance and develop the signal. FIG. 1 shows an exemplary 1/2 Vdd sensing scheme. After sensing, the pair of bit-lines are restored back to 1/2 Vdd level via a precharge and equalization circuit 101 formed by three nMOS devices, N12, N13 and N14. The write operation is done by directly connecting datalines to the bitline pairs without using the direct sensing devices. At the same time, the cross-coupled sensing circuit can be activated to help boost the incoming signals.

Unlike the present invention, the prior art uses a complementary signal development. In other words, a pair of true and complement signals is used for each write or read operation. The prior art also uses 1/2 Vdd sensing, and therefore requires precharge and equalization circuit. Unlike the prior art, the present invention does not use complementary signal development, uses a Vdd precharging sensing scheme applied to the sense node, and conducts dynamic discharge during sensing.

Figure 2:
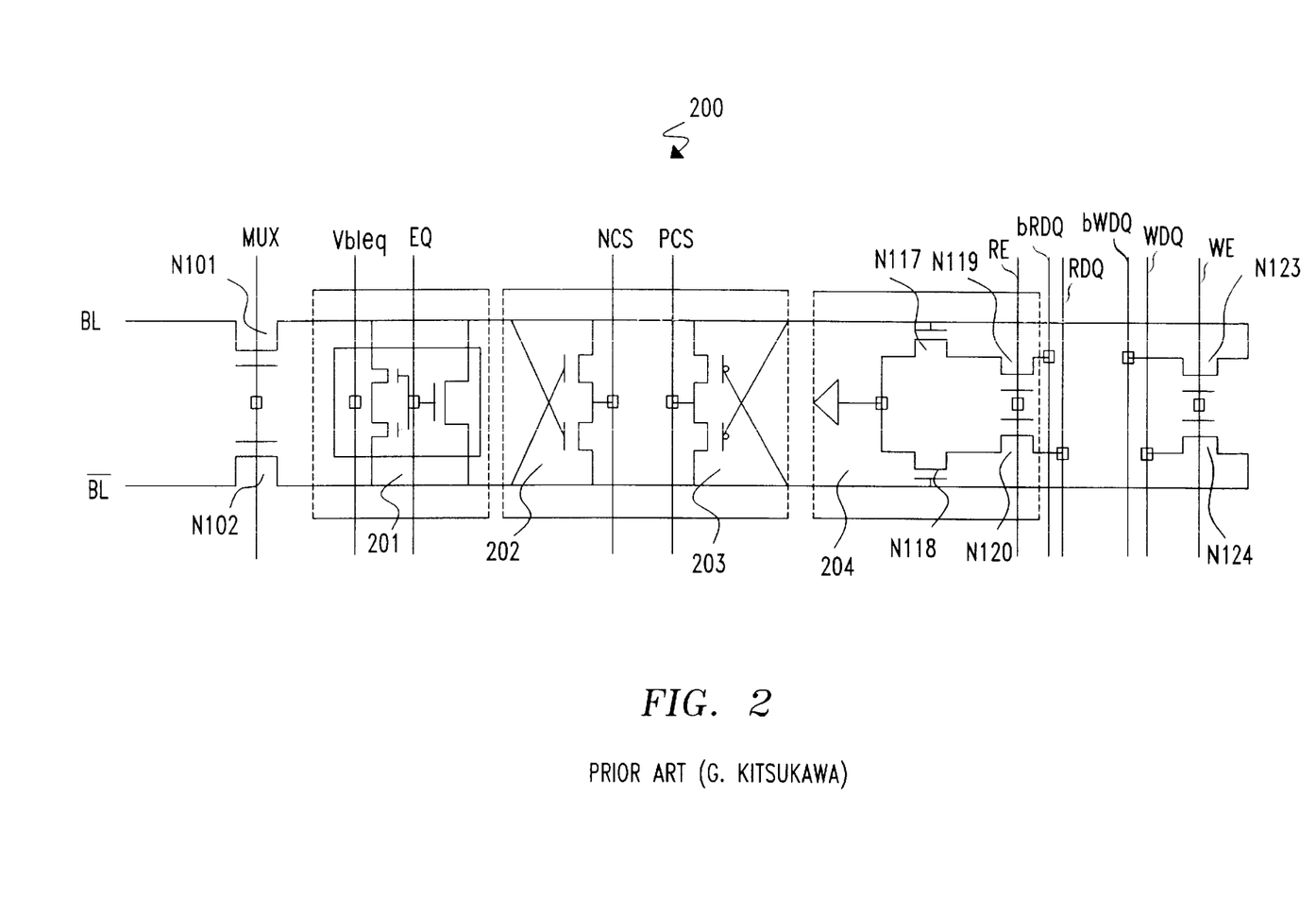
FIG. 2 shows another prior art approach similar to that of FIG. 1, except that the incoming WDQ and bWDQ and out-going RDQ and bRDQ data line pairs are separated.

FIG. 2 shows another prior art approach similar to that of FIG. 1, except that the incoming WDQ and bWDQ and out-going RDQ and bRDQ dataline pairs are separated. In this case, although the number of datalines is doubled, it is possible to perform different operations simultaneously on different banks of the DRAM. The direct sensing part 204 is exactly the same as 104 shown in FIG. 1 with no fundamental difference therebetween.

Figure 3:
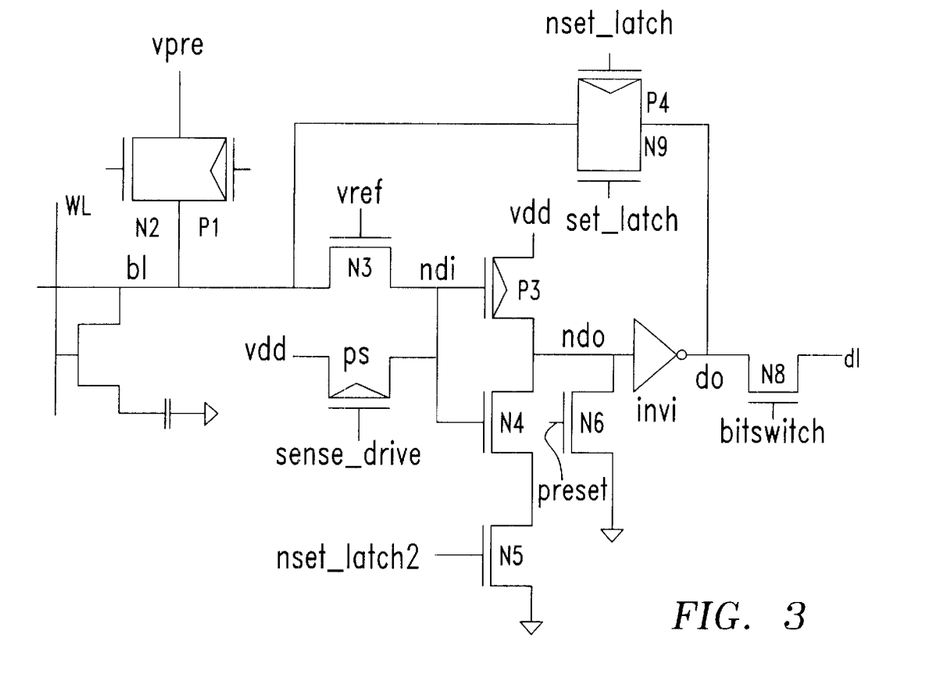
FIG. 3 illustrates a prior disclosure (YOR920000469US1) direct sensing alternative which uses a current sensing scheme.

FIG. 3 illustrates a prior invention disclosure which is not necessarily prior art (disclosure #YOR920000469US1) which is a direct sensing alternative which uses a current sensing scheme. The initial state of the sense amplifier is that the BL is precharged to Vpre through devices N2 and P1, with Vpre being a voltage close to Vref, which is applied to the gate of transistor N3. The relation of Vpre and Vref is such to place the device N3 in the sub-threshold region. The sense line SL is precharged to VDD through device P2 and the node NDO is precharged to ground through the device N6.

During the sensing of a '0' data type, the BL develops a signal and results in a gate-source voltage below the threshold of the N3 transistor. Because the nFET is biased in the subthreshold region, the current flowing therethrough is exponentially related to the gate-source voltage. Thus, very small signals can be detected. As current flows through N3, the capacitance of the sense line is discharged until it turns on the pFET P3. This pulls up the node NDO and registers that a 0 is sensed from the BL. The transfer gate formed by devices N9 and P4, as well as devices N4 and N5, and inv1 are activated to feed the signal back to the BL to restore the signal to the cell after the sensing operation.

The reading of a '1' data type does not result in a change of the SL and NDO node potentials since the device N3 remains off. However, the full signal is still restored to the BL via the N9/P4 transfer gate, N4, N5 and inv1.

The present invention differs from the current sensing approach of FIG. 3 in that it relies on the pFET threshold voltage (devices P1/P2 of FIG. 6) to detect the signal level. The resulting design produces a full swing output as shown by the waveforms in FIG. 7 with a significant reduction in the number of devices in the primary sense amplifier. By comparison, YOR9-2000-0469 is not as simple, has more transistors, and requires two more voltages Vpre and Vref.

Figure 4:
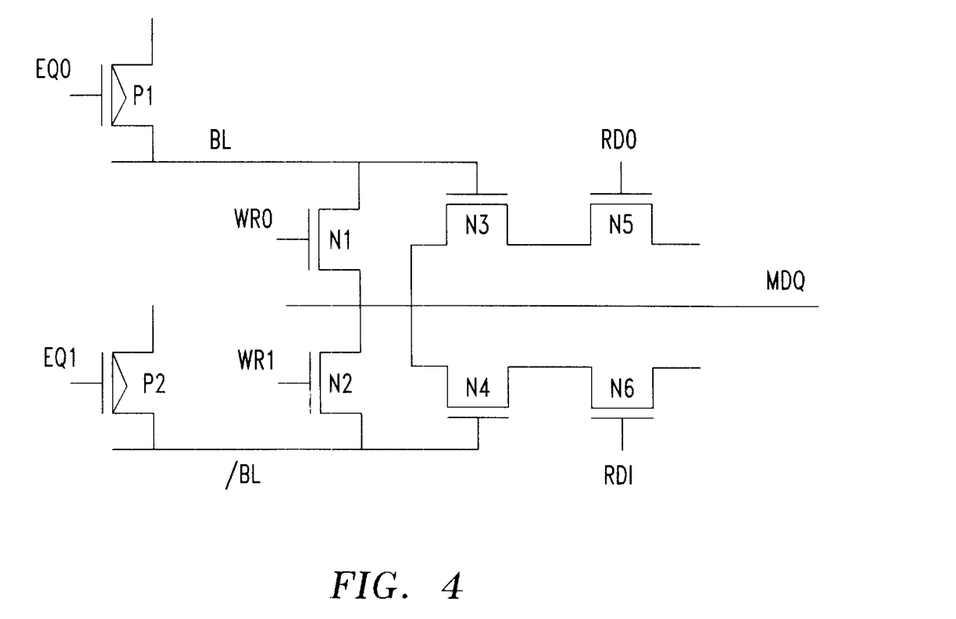
FIG. 4 illustrates prior disclosure (BUR820000488) which utilizes the direct sense for the write operation (devices N1/N2) and the read operation (devices N5/N6), which is equivalent to the 104 and 105 circuit portions in the prior art of FIG. 1.

FIG. 4 illustrates a prior invention disclosure which is not necessarily prior art (disclosure #BUR820000488) which utilizes the direct sense for the write operation (devices N1/N2) and the read operation (devices N5/N6), which is equivalent to the 104 and 105 circuit portions in the prior art of FIG. 1. Unlike FIG. 1, however, the full signal development and writeback devices (the cross-coupled pair) are moved to the secondary sensing circuitry to reduce the sense amplifier size. Further, it performs the conversion of a bitline pair to a single output signal line MDQ by utilizing devices N5 and N6 controlled by signals RD0 and RD1. Finally, it controls the BL and /BL precharge devices (P1 and P2 controlled by signals EQ0 and EQ1) independently, and thus provides for BL-BL noise shielding during the sensing operation.

Although the present invention contains one more device per BL than the prior art of FIG. 4, an advantage over the design of the present invention is that no critical timing of the sense amplifier control signal is required—once the circuit is precharged, the BL either swings enough to trip the circuit, or it does not. Finally, unlike the prior art of FIG. 4, in the present invention the polarity of the BL and MDQ nodes is the same. Thus, the devices N7/N8 of FIG. 6 can be used to write the data back into the BL at the primary sense amplifier.

Figure 5:
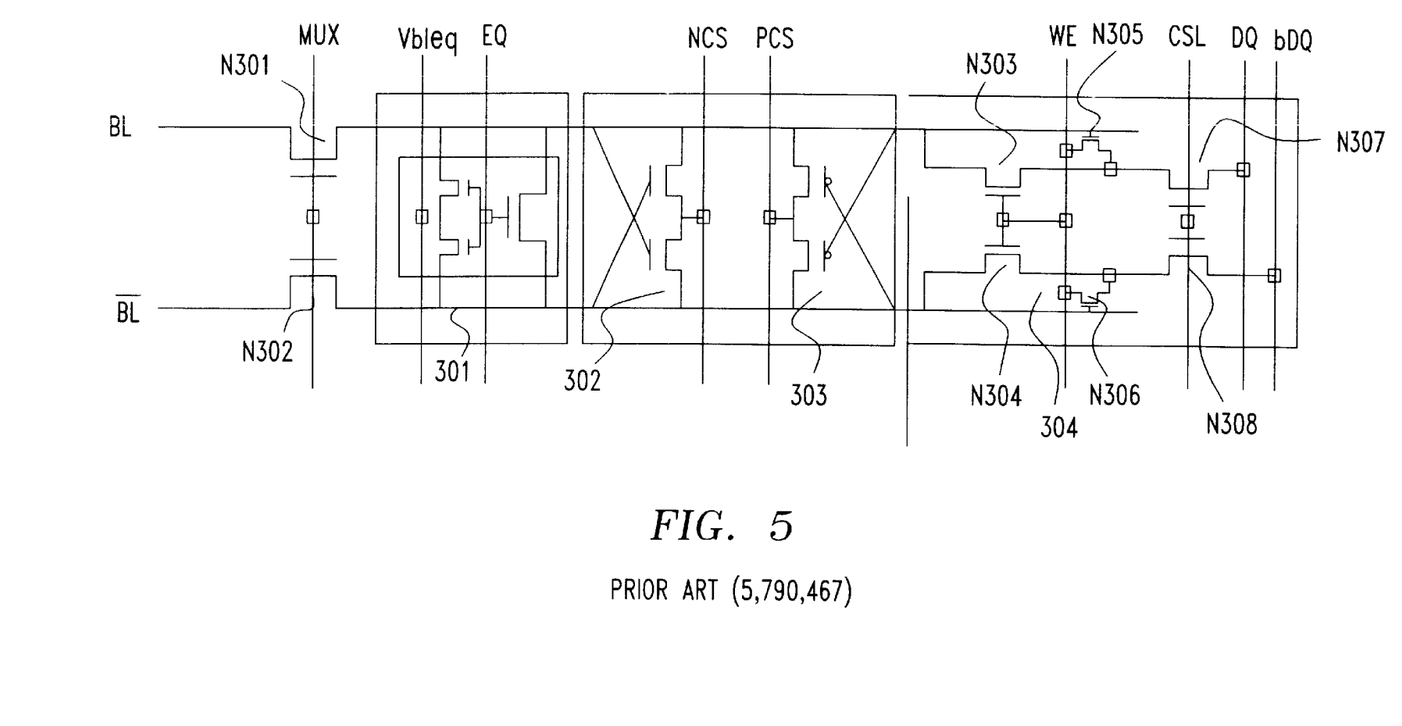
FIG. 5 illustrates another prior art approach which uses direct sensing to reduce the number of devices of the sense amplifier.

FIG. 5 illustrates another prior art approach which uses direct sensing to reduce the number of devices of the sense amplifier. As shown in FIG. 5, the write and read control signals are shared. When the write control signal WE=1, a write operation is issued, otherwise a read operation is defined, which eliminates a pair of switches and a control signal wire.

During a read operation when WE=0, two nMOS devices N305 and N306 become the pair of pull-down NMOS devices, which are similar to N117 and N118 respectively of FIG. 2. At this moment, two write devices N303 and N304 are shut off. The concern here is that the line WE not only serves as the signal line, but also serves as the low-impendence ground power line. The wiring of the line WE has to be sufficiently wide to ensure high current sinking for high-speed switching.

During a write operation when WE=1, data are directly fed from DQ and bDQ to the corresponding bitline pairs. In all three examples mentioned herein, a cross-coupled sense amplifier component is used to enhance the read signal on the bit line and to provide for a means to write-back the data to the memory cell after the read operation.

SUMMARY OF THE INVENTION

Accordingly, it is a primary object of the present invention to provide a DRAM direct sensing scheme.

A further object of the subject invention is the provision of a DRAM direct sensing scheme which does not use the development of true and complementary signals, uses a Vdd precharging sensing scheme applied to a sense node, and conducts dynamic discharge during sensing.

In accordance with the teachings herein, the present invention provides a DRAM direct sensing scheme which maintains the same polarity (even number of signal inversions) between the bitline BL signal and the dataline DQ signal, such that the primary sense amplifier can be employed to write-back data into the storage capacitor of the memory cell.

BRIEF DESCRIPTION OF THE DRAWINGS

The foregoing objects and advantages of the present invention for a DRAM direct sensing scheme may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

The present invention provides a DRAM direct sensing circuit and method which provides for open bitline sensing. Sensing means reading the contents of a memory cell, and open bitline means without using a reference bitline signal. The concept of open bitline sensing is not new, but the open bitline sensing circuit of the present invention is very fast compared to conventional sensing circuits, such as folded bitline sense amplifiers in use today. Besides speed, its other advantages include simplicity, few elements, and small IC space.

The read operation in a DRAM is inherently destructive because once the transistor for a memory cell is switched on, the charge on the memory cell capacitor dissipates onto the bitline and eliminates its once readable logic level. Therefore, conventional DRAMs employ a writeback cycle as part of the read operation.

Figure 7:
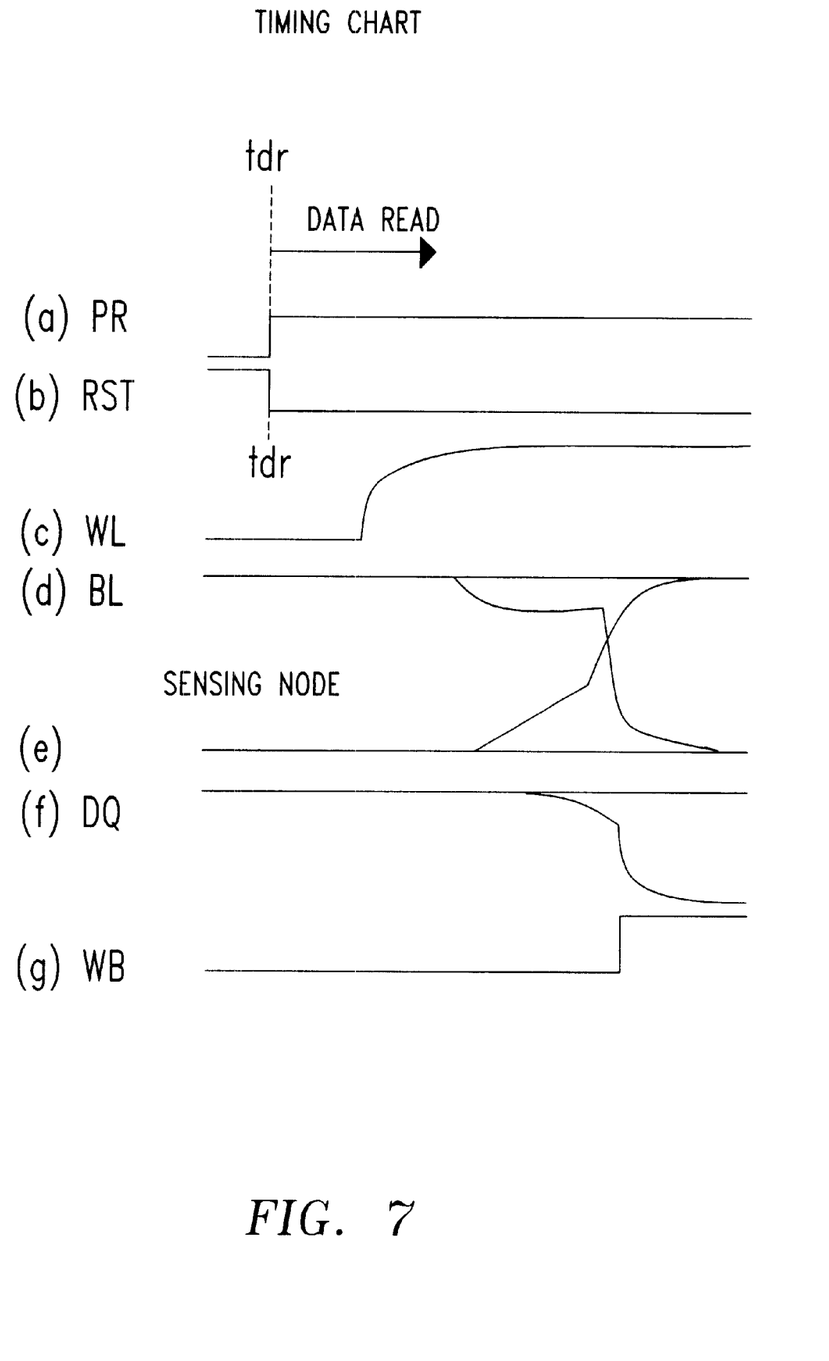
FIG. 7 illustrates timing waveforms which illustrate the operation of the DRAM direct sensing scheme of FIG. 6.

The present invention enables a faster writeback operation, as illustrated by the waveforms and timing diagrams of FIG. 7, and writeback is done from the data latched on the DQ (data output) line. The present invention begins writeback as soon as the DQ dataline signal level has begun switching to the level of the accessed data bit.

The circuit operates as follows:
1. The bitline BL is precharged to Vblh, and the dataline DQ is precharged to Vblh.
2. The sensing node SN is precharged to ground.
3. If the stored memory bit is a low, a pFET part of the primary sense amplifier SA turns on after only a slight decrease in the bitline voltage, which activates an nFET part of the primary sense amplifier, and changes the DQ signal level quickly from a high to a low. The DQ signal is then available to be read by a secondary sense amplifier (SSA).
4. If the stored memory bit is a high, the SA is not turned on and the DQ signal remains at its high precharge level.
5. With the DQ signal developed, the data bit is then immediately written back into the accessed memory cell.

Figure 6:
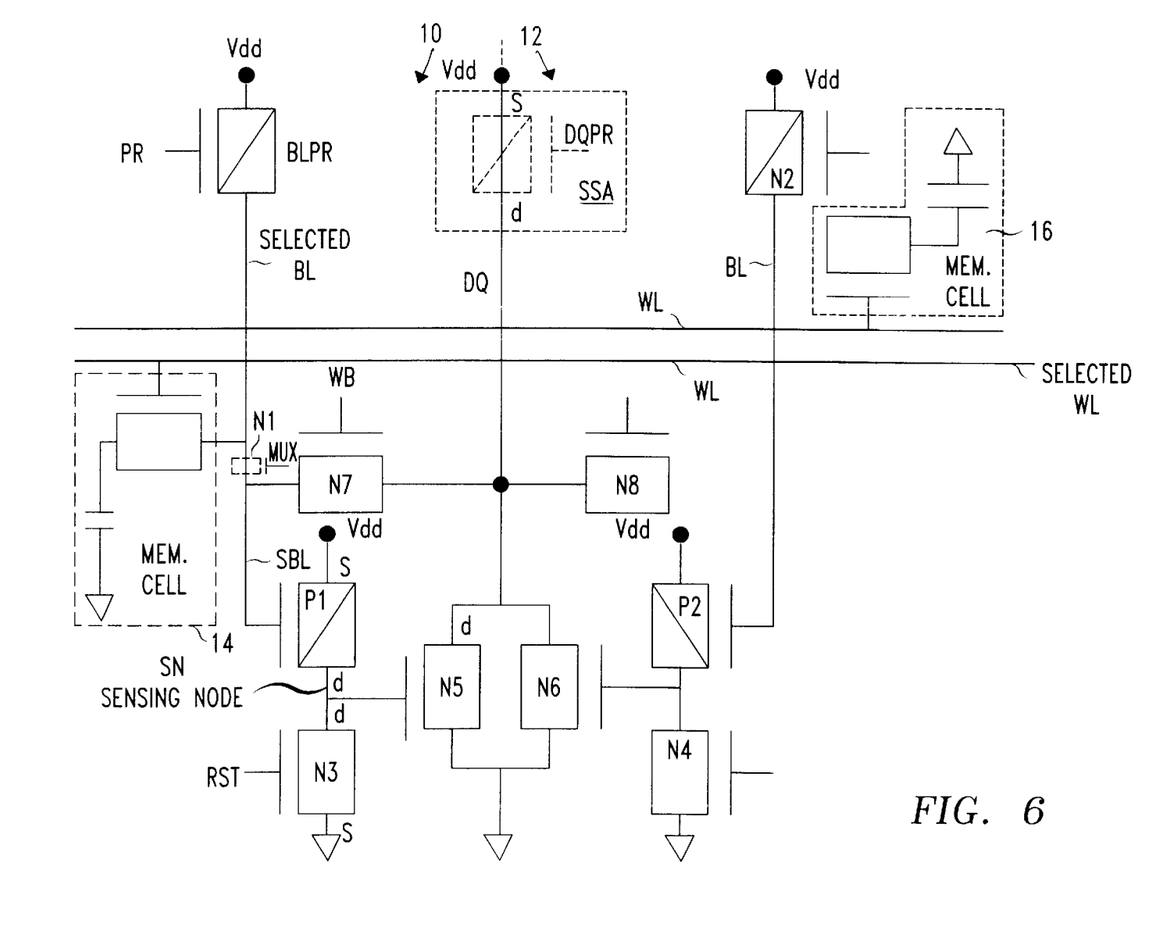
FIG. 6 illustrates an embodiment of the present invention for a DRAM direct sensing circuit and method which provides for open bitline sensing.

FIG. 6 illustrates an embodiment of the present invention for a DRAM direct sensing scheme, and FIG. 7 illustrates timing waveforms which illustrate the operation of the DRAM direct sensing scheme of FIG. 6.

FIG. 6 shows a mirror arrangement of substantially identical first and second DRAM direct sensing circuits 10, 12 for first and second memory cells 14, 16 which are arranged symmetrically on left and right sides of the output data line DQ which is shared by both memory cells. Each memory cell comprises a storage capacitor and a selection nFET transistor whose gate is connected to a wordline WL and whose output drain is connected to a bitline BL, as is generally known in the art.

The following explanation is for the DRAM direct sensing circuit 10 and memory cell 14, which is connected to the Selected BL and the Selected WL, and the DRAM direct sensing circuit 12 operates in the same manner.

In the primary sense amplifier (SA) 10, the selected BL is coupled to a bitline precharge pFET device BLPR, which is responsive to a gate input PR, FIG. 7a, to precharge the bitline to a bitline precharge voltage Vblh prior to a data read operation. The output data line DQ is also coupled to a data line precharge pFET device DQPR (shown in phantom as it is normally a part of a secondary sense amplifier (SSA)), for precharging the data line to a data line precharge voltage prior to the data read operation. The DQPR device (shown in phantom) is connected between the DQ node (drain) and the power supply Vdd (source). Both the source and the drain of the device are attached to the DQ line which then segments the DQ line into two nodes and the DQPR device acts as a passgate.

The DQPR device (shown in phantom) is connected between the DQ node (drain) and the power supply Vdd (source). Both the source and the drain of the device are attached to the DQ line which then segments the DQ line into two nodes and the DQPR device acts as a passgate.

Prior to a data read operation at time tdr, FIG. 7, the bitline precharge device BLPR and the data line precharge device DQPR are activated by a low signal PR, FIG. 7a, applied to their gates to precharge both lines to a precharge voltage, which is the internal power supply voltage Vdd in the embodiment illustrated in FIG. 1. Similarly, prior to a data read operation at time tdr, the sensing node SN is precharged to ground by activating nFET reset device N3 by a high signal RST, FIG. 7b, applied to its gate. The reset nFET transistor N3 connects the sense node SN to ground, and the sense node is precharged to ground by applying a reset signal RST to the gate of the reset transistor.

At the time of a data read operation tdr, the signals PR and RST are reversed, FIGS. 7a and 7b, so that the bitline BL, the data line DQ and the sense node SN are now all floating.

The waveforms of FIG. 7 illustrate in solid lines a read operation for a low or 0 bit, and illustrate in dotted lines a read operation for a high or 1 bit.

The primary sense amplifier includes a pFET sensing device P1 having its gate coupled to a signal developed on the bitline SBL from the memory cell 14 to detect and amplify the signal level thereof. Its source is coupled to a voltage source Vdd and its drain is coupled to the sense node SN, such that the signal developed on the bitline determines the degree of turn-on of the pFET sensing device P1. An nFET device N5 has its gate coupled to the sense node SN to detect and amplify the signal level thereof, and has its drain coupled to the data line DQ, such that both the pFET device P1 and the nFET device N5 amplify the signal developed on the bitline SBL.

During a data read operation, FIG. 7c illustrates a WL signal applied to and developed on the selected wordline WL which turns on the nFET device in the memory cell 14. Assume that a 0 is stored in the memory cell, such that charge sharing from the bitline to the memory cell causes the signal BL developed on the bitline to gradually decrease, as illustrated by the solid waveform in FIG. 7d. The signal developed on the bitline BL and the selected bitline SBL, as explained herein below, causes current through the pFET device P1 to charge the SN node and turn on the nFET device N5. As the device P1 becomes more conductive, the signal voltage at the sense node SN, which had been precharged to ground, rises as shown in FIG. 7e.

This in turn causes the conductive device N5 to pull down the precharged data line DQ gradually and then more sharply as the signal continues to develop on the bit line.

As the signal is fully developed on the data line DQ, FIG. 7f, a writeback nFET device N7, coupled between the data line DQ and the bitline BL, is switched on in response to a writeback signal WB applied to its gate, to begin a data writeback of the signal developed on the data line DQ back into the memory cell.

The dotted waveforms of FIG. 7 indicate a data read operation for a high or 1 stored signal. In a read operation of a high or 1, when the wordline signal WL turns on the nFET device in the memory cell, the stored high signal does not pull down the bitline BL, as indicated by the dotted waveform in FIG. 3d, and so the devices P1 and N5 are not turned on, and the sense node SN remains at its precharge ground potential, and the data line DQ remains at its precharge high voltage, as indicated by the dotted waveforms of FIGS. 7e and 7f. The writeback operation remains the same as previously explained.

FIG. 6 illustrates in phantom a further nMOS device N1 which is optional, and separates the bit line BL from the sense amplifier input node SBL. The device N1 can be responsive to a multiplex signal MUX to multiplex or switch one of multiple bitlines BLs onto a common SBL node, to allow multiple bitlines to share a single primary sense amplifier, and also to isolate the capacitance of each bitline from the SBL node.

In a preferred mode of operation, only every other bitline is active at any one time, such that the alternating nonactive bitlines can be held at AC ground to eliminate line to line coupling effects, to provide enhanced signal shielding and to increase the bitline signal sensing margin.

In a first embodiment of the present invention, both the bitline and the dataline are precharged to the same precharge voltage prior to a data read operation. During the reading of a one data type, the bit line does not change voltage due to charge sharing, since the voltage stored in the memory cell and the bit line is the same. Thus, when the DQ is connected to the bit line during the writeback portion of the cycle, no change in voltages on any signal line takes place. However, if the one data type stored in the cell is weak (not a full logic level), but still strong enough to be read as a one, it then pulls down slightly on the BL. When the DQ is attached to the BL during the writeback portion of the cycle, charge is transferred from the DQ (which has a higher capacitance) to the BL to writeback the signal to the memory cell. The writeback will not be to a full logic level, but will be higher than the one data type that was previously stored in the cell. In an alternative embodiment, the secondary sense amplifier can be employed to write a full logic level back to the memory cell via the device N7.

In the circuit of FIG. 6, the pFET device P1 and the nFET device N5 maintain an even number of signal inversions between the bitline signal BL and the data line DQ signal, to enable the primary sense amplifier SA to be employed to writeback data into the storage capacitor of the memory cell.

The first embodiment of the present invention uses a direct sense amplifier without using a reference bitline, and uses a Vblh precharge scheme. The developed signal is applied to the gate of a pFET, whose source is connected to the Vdd power line. In the case of a zero, the developed signal causes current through the pFET to charge the nFET gate connected to the drain of the pFET, which is floating at this stage. This amplifies the signal on the bitline and starts to pull down the DQ data line, which is also precharged at Vblh. After developing enough signal on the DQ data line, the writeback transistor (WB) is turned on, so that a writeback loop is established to pull down the BL quickly. The data line DQ is connected to the secondary sense amplifier as usual, which fetches data for the I/O and senses the polarity of data from the primary sense amplifier.

A second advantage of applying the developed signal to the gate of a pFET is that the logical inversion removes the possibility of a glitch propagation through the primary sense amplifier to the DQ line. Applying the developed signal to the gate of an nFET would require careful timing controls on the direct sense enable signal in order to prevent a glitch on the DQ line.

The sensing scheme of the present invention amplifies the signal developed on the bitline without requiring any reference voltage. By using the sub Vt characteristics of the pFET, there is an exponential relationship between the current flowing through the device and the bit line signal applied to the gate.

FIG. 6 illustrates the direct sensing scheme of the present invention in a single rail, dynamic Vdd sensing approach which includes a pair of sense amplifiers 10 and 12 in a mirror-image arrangement. The pair shares the same read node which connects to the DQ data line. Each can include an MUX switch N1 which connects one of the bitlines BL0 or BL1 to its respective sense amplifier. It also comprises a read portion formed by a pull-up pMOS device P1 or P2 and a pull-down NMOS device N3 or N4. The source of the pMOS device is tied to a voltage supply which can be the same or higher than the internal power supply Vdd. As an alternative embodiment, the source of the device P1 or P2 can be brought to a higher voltage than Vdd to improve the gain of this device. It is preferable for improved performance that this voltage supply be a boosted voltage level similar to the boosted wordline voltage Vpp. The output of the device P1 or P2 is tied to the gate of another nMOS device N5 or N6. The source of the pMOS device is tied to a voltage supply which can be the source of each nMOS device that is tied to ground.

Prior to a read operation, the sense node SN is precharged to ground. Unlike the prior art, the gate of the gain device N5 or N6 is not tied to the bitline, but instead is tied to a precharge sense node SN. During reading a "low" or "high" signal, after the wordline (not shown) is activated, the signal developed on the originally Vdd precharged bitline BL0 or BL1 determines the degree of turn-on of the pull-up pMOS device P1 or P2.

For reading a "low", the pMOS turns on more, and raises the sense node, which in turn pulls the dataline DQ to ground.

For reading a "high", the pMOS remains shut-off, and the gain device is not turned on, and therefore the Vdd precharged dataline remains high.

While several embodiments and variations of the present invention for a DRAM direct sensing scheme are described in detail herein, it should be apparent that the disclosure and teachings of the present invention will suggest many alternative designs to those skilled in the art.

What is claimed is:

1. A direct sensing circuit for reading data from a memory cell connected to a bitline, with open bitline sensing without using a reference bitline signal, onto a data line in a data read operation, comprising:

a bitline precharge circuit for precharging the bitline to a bitline precharge voltage prior to the data read operation;

a data line precharge circuit for precharging the data line to a data line precharge voltage prior to the data read operation;

a pFET device having its gate coupled to a signal developed on the bitline from the memory cell to detect and amplify the signal level thereof, and having its source coupled to a voltage source and its drain coupled to a sense node, such that the signal developed on the bitline determines the degree of turn-on of the pFET device;

an nFET device having its gate coupled to the sense node to detect and amplify the signal level thereof, and having its drain coupled to the data line, such that when sensing a low data signal the signal developed on the bitline causes subthreshold voltage leakage current through the pFET device to charge the gate of the nFET device which is floating to amplify the signal developed on the bitline and to pull down the precharged data line, and when sensing a high data signal, the pFET device and the nFET device remain inactivated and the data line remains at its precharge high voltage.

2. The direct sensing circuit of claim 1, wherein a writeback device is coupled between the data line and the bitline which is switched on to begin a data writeback into the memory cell when the signal develops on the data line.

3. The direct sensing circuit of claim 2, wherein the writeback device is an nFET device.

4. The direct sensing circuit of claim 1, wherein a reset device connects the sense node to ground, and prior to a data read operation the sense node is precharged to ground by applying a reset signal to the gate of the reset device.

5. The direct sensing circuit of claim 4, wherein the reset device is an nFET device.

6. The direct sensing circuit of claim 1, wherein both the bitline precharge circuit and the dataline precharge circuit precharge their respective lines to the same precharge voltage prior to a data read operation.

7. The direct sensing device of claim 6, wherein the same precharge voltage is Vdd, the internal power supply voltage.

8. The direct sensing circuit of claim 1, wherein a secondary sense amplifier performs writeback of a data signal back into the memory cell.

9. The direct sensing circuit of claim 1, wherein a bitline precharge device connects a precharge voltage to the bitline.

10. The direct sensing circuit of claim 9, wherein the bitline precharge device is a pFET device.

11. The direct sensing circuit of claim 1, wherein a bitline switch device connects the memory cell to the pFET device.

12. The direct sensing circuit of claim 4, wherein the bitline switch device is an nFET device.

13. The direct sensing circuit of claim 1, including a memory array of said memory cells and said direct sensing circuits, wherein alternating bitline switch devices are activated, such that only every other bitline is activated, and nonactivated alternating bitlines are held at AC ground to eliminate line to line coupling effects, and to increase the bitline signal sensing margin.

14. The direct sensing circuit of claim 1, wherein the pFET device and the nFET device maintain an even number of signal inversions between the bitline signal and the data line signal, to enable the primary sense amplifier writeback data into a storage capacitor of the memory cell.

15. The direct sensing circuit of claim 1, wherein the direct sensing circuit conducts dynamic discharge during sensing.

16. The direct sensing of claim 1, wherein the source of the pFET device is coupled to a voltage higher than the internal supply voltage Vdd to improve the gain of the pFET device for improved performance.

17. A method of direct sensing of data from a memory cell connected to a bitline, with open bitline sensing without using a reference bitline signal, onto a data line in a data read operation, comprising:

precharging the bitline to a bitline precharge voltage prior to the data read operation;

precharging the data line to a data line precharge voltage prior to the data read operation;

detecting and amplifying a signal developed on the bitline from the memory cell using a pFET device having its gate coupled to the signal developed on the bitline, and having its source coupled to a voltage source and its drain coupled to a sense node, such that the signal developed on the bitline determines the degree of turn-on of the pFET device;

detecting and amplifying the signal developed at the sense node using an nFET device having its gate coupled to the sense node, and having its drain coupled to the data line, such that when sensing a low data signal the signal developed on the bitline causes subthreshold voltage leakage current through the pFET device to charge the gate of the nFET device which is floating to amplify the signal developed on the bitline and to pull down the precharged data line, and when sensing a high data signal, the pFET device and the nFET device remain inactivated and the data line remains at its precharge high voltage.

* * * * *